United States Patent [19]

Quinn et al.

[11] Patent Number: 5,219,796

[45] Date of Patent: Jun. 15, 1993

[54] METHOD OF FABRICATING IMAGE SENSOR DIES AND THE LIKE FOR USE IN ASSEMBLING ARRAYS

[75] Inventors: Kraig A. Quinn; Brian T. Ormond, both of Webster; Josef E. Jedlicka, Rochester, all of N.Y.

[73] Assignee: Xerox Corporation, Stamford, Conn.

[21] Appl. No.: 787,444

[22] Filed: Nov. 4, 1991

[51] Int. Cl.⁵ .......................................... H01L 21/302
[52] U.S. Cl. ................................. 437/227; 437/226; 437/66; 148/DIG. 28
[58] Field of Search ............... 437/229, 226, 227, 974, 437/66; 148/DIG. 135, DIG. 28

[56] References Cited

U.S. PATENT DOCUMENTS

| | | |
|---|---|---|
| 4,604,161 | 8/1986 | Araghi . |
| 4,814,296 | 3/1989 | Jedlicka et al. . |
| 4,925,808 | 5/1990 | Richarson ........................ 437/227 |
| 5,000,811 | 3/1991 | Campanelli ...................... 437/226 |
| 5,128,282 | 7/1992 | Ormond et al. ................. 437/226 |

FOREIGN PATENT DOCUMENTS

| | | | |
|---|---|---|---|
| 0051392 | 4/1979 | Japan .............................. 437/226 |
| 0081651 | 4/1986 | Japan .............................. 437/227 |
| 0028972 | 1/1989 | Japan .............................. 437/905 |
| 0033948 | 2/1990 | Japan .............................. 437/226 |
| 2025107 | 1/1980 | United Kingdom ............ 156/257 |
| 2095897 | 10/1982 | United Kingdom ............ 437/227 |

*Primary Examiner*—Brian E. Hearn
*Assistant Examiner*—Michael Trinh
*Attorney, Agent, or Firm*—F. E. McMullen

[57] ABSTRACT

An improved process for forming individual dies having faces that allow the dies to be assembled against other like dies to form one and/or two dimensional scanning arrays with minimal chipping and fracturing wherein the active side of a wafer is etched to form separation grooves with the wall of the grooves adjoining the die presenting a relatively wide surface to facilitate sawing, wide grooves are cut in the inactive side of the wafer opposite each separation grooves, and the wafer cut by sawing along the separation grooves, the saw being located so that the side of the saw blade facing the die is aligned with the midpoint of the wide wall so that on sawing the bottom half of the wall and the remainder of the grooves are obliterated leaving the top half of the wall to prevent cracking and chipping during sawing.

15 Claims, 3 Drawing Sheets

METHOD OF FABRICATING IMAGE SENSOR DIES AND THE LIKE FOR USE IN ASSEMBLING ARRAYS

The invention relates to a method of fabricating image sensor dies suitable for assembly with other like dies to form a longer composite array, and more particularly, to an improved fabrication method which reduces the incidence of chipping and fracturing at the die ends during fabrication.

Image sensor dies for scanning document images, such as Charge Coupled Devices (CCDs), typically have a row or linear array of photosites together with suitable supporting circuitry integrated onto silicon. Usually, a die of this type is used to scan line by line across the width of a document with the document being moved or stepped lengthwise in synchronism therewith.

In the above application, the image resolution is proportional to the ratio of the scan width and the number of array photosites. Because of the difficulty in economically designing and fabricating long dies, image resolution for the typical die commercially available today is relatively low when the die is used to scan a full line. While resolution may be improved electronically as by interpolating extra image signals, or by interlacing several smaller dies with one another in a non-colinear fashion so as to cross over from one die to the next as scanning along the line progresses, electronic manipulations of this type adds to both the complexity and the cost of the system. Further, single or multiple die combinations such as described above usually require more complex and expensive optical systems.

However, a long or full width array, having a length equal to or larger than the document line and with a large packing of co-linear photosites to assure high resolution, has been and remains a very desirable but so far unattainable aim. In the pursuit of a long or full width array, forming the array by assembling several small dies together end to end has often been postulated. However, the need, which is critical, to provide dies whose photosites extend to the border or edge of the die, so as to assure continuity when the die is assembled end to end with other dies, and at the same time provide edges that are sufficiently smooth and straight to be assembled together without loss of image data has proved to be a formidable obstacle.

Although the standard technique of scribing and cleaving silicon wafers used by the semiconductor industry for many years produces dies having reasonably controlled dimensions, the microscopic damage occurring to the die surface during the scribing operation has effectively precluded the disposition of the photosites at the die edge. This is because the top surface of silicon wafers is virtually always parallel to the <100> plane of the crystalline lattice so that, when a wafer of this type is cut or diced with a high speed diamond blade, chips and silvers are broken away from the top surface of the wafer in the direct vicinity of the channel created by the blade. This surface chipping may extend to about 50 μm, thus rendering it impossible for active elements to be located any closer than about 50 μm from the dicing channel. As a result, long linear arrays made up of individual dies assembled together end to end are only possible for low resolution devices, i.e., those having a spatial frequency of 5 lines per mm or less.

In the prior art, an earlier patent by Mehdi N. Araghi, U.S. Pat. No. 4,604,161, assigned to the same assignee as the present invention, addressed this problem. Araghi discloses the concept of chemically etching a V-shaped groove in the surface of a wafer followed by a partial cut in the back of the wafer forming an inside groove directly underneath the V-shaped groove. This allows the dies to be separated from one another by means of a mechanical cleaving or breaking operation. In this approach, the cut through the top surface of the wafer, in which the active elements are built, was not made with an abrasive blade but by means of the chemically etched V-shaped groove. As a result, the propagation of mechanical damage along the top surface of the wafer was avoided, allowing active elements to be placed as close to the V-shaped groove as the accuracy of the photolithography and the etching operation would allow.

However, the Araghi technique left at least one face of the cleaved chip with a protruding knife edge defined by two intersecting <111> planes. The knife edge can be very delicate and easily damaged. Such damage may require that the chip be rejected, reducing fabrication yields and increasing cost.

U.S. Pat. No. 4,814,296 issued in the names of Josef E. Jedlicka et al, entitled "Method of Fabricating Image Sensor Dies for use in Assembling Arrays", and assigned to the same assignee as the present invention, describes a technique for fabricating sensor dies in which V-shaped grooves delineated the chip ends are etched into a silicon wafer. A dicing saw blade is positioned so that the side of the blade facing the die is aligned with the bottom of the V-shaped groove and the cut made. This process retains intact one side of the V-shaped groove to intercept and prevent cracks and chipping caused by sawing from damaging the die active surface and any circuits thereon.

It has been found, however, that getting the die side of the dicing saw blade exactly lined up with the bottom of the V-shaped groove as suggested by the above-cited Jedlicka et al patent is unlikely as a practical matter because of the small errors that normally occur in wafer fabrication and errors in positioning the dicing saw blade. Further, it has been found that, because of the difficulty in aligning the saw blade with the bottom of the V-shaped groove, significant chipping occurs. Additionally, easily fracturable material is left that can lead to debris in the butting zone when the dies are later assembled which can result in out-of-tolerance die butts leading to reduced product yield.

The present invention seeks to address and rectify the above by providing an improved method of fabricating a high resolution image sensor die from a <100> silicon wafer in which the heretofore critical need to locate the point of sawing at the bottom of the separation groove is avoided, enabling a die with a precision face at each end of the die for abutment with other like dies to be fabricated, comprising the steps of: etching a first V-shaped groove in one side of the wafer delineating where the die is to be separated from the wafer with the wall of the groove next to the die being relatively wide and parallel to the <111> crystalline plane of the wafer; forming a second groove in the opposite side of the wafer opposite the first groove with the axis of the second groove parallel to the axis of the first groove; and sawing the wafer along the first groove with one edge of the cut made by sawing at a point nominally centered on the slope next to the die relatively wide wall of the first groove, the relatively wide wall allowing for misalignment of the cut made by sawing while providing a remaining wall section to prevent development of fractures in the die along the cut.

As used herein, the term face refers to any side or end of a die that is desired to be precision formed for the purpose of being assembled with other like dies to form a larger one and/or two dimensional array.

Figure 1:
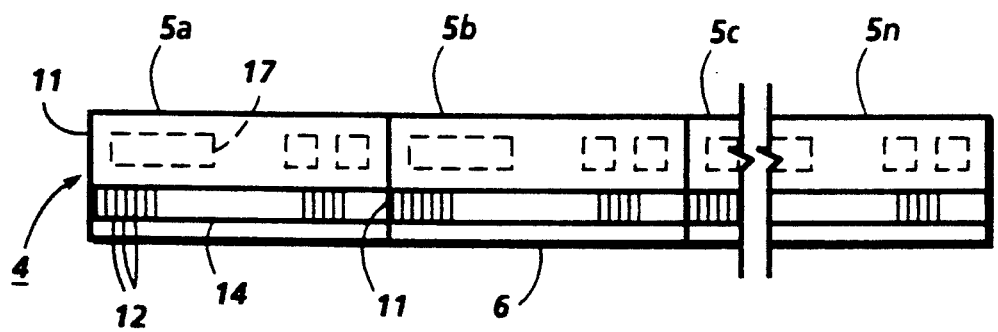
FIG. 1 is a top view illustrating a long array composed of several dies fabricated in accordance with the teachings of this invention assembled together.

Referring particularly to FIG. 1 of the drawings, there is shown a long or full width scanning array 4 composed of a plurality of smaller sensor dies 5 assembled together end to end (depicted by numerals 5a, 5b, ... 5n in FIG. 1 of the drawings). Dies 5, which may, for example, comprise Charge Coupled Devices (CCDs), are fabricated in accordance with the teachings of the invention as will appear more fully hereinbelow.

As will be understood by those skilled in the art, array 4 is typically used to read or scan a document original line by line and convert the document image to electrical signals. Preferably, array 4 is a full length array having an overall length equal to or slightly greater than the width of the largest document to be scanned. As will appear, dies 5 are fabricated so that row 14 of photosites 12 of each die extends adjacent the edges or ends of the die so that when dies 5 are assembled together, there is formed a continuous and uninterrupted row of photosites with a substantially uniform periodicity on array 4.

Typically, dies 5 are made of relatively thin silicon and has a generally rectangular shape, with the axis of row 14 of photosites paralleling the longitudinal axis of the dies. While a single row 14 of photosites 12 is shown, plural photosite rows may be contemplated. Other active elements such as shift registers, gates, pixel clock, etc. (designated generally by the numeral 17 herein), are preferably formed integral with die 5. Suitable external connectors (not shown) are provided for electrically coupling the dies 5 to related external circuitry.

When a single die is used for scanning purposes, the image resolution achieved is a function of the number of photosites 12 that can be fabricated on the die divided by the width of the scan line. Since the number of photosites 12 that can be packed onto a single die is limited, it would be advantageous if several dies could be assembled together end to end to form a longer array, and preferably to form a full width or full size array whose scan area is coextensive with the scan line.

Figure 2:
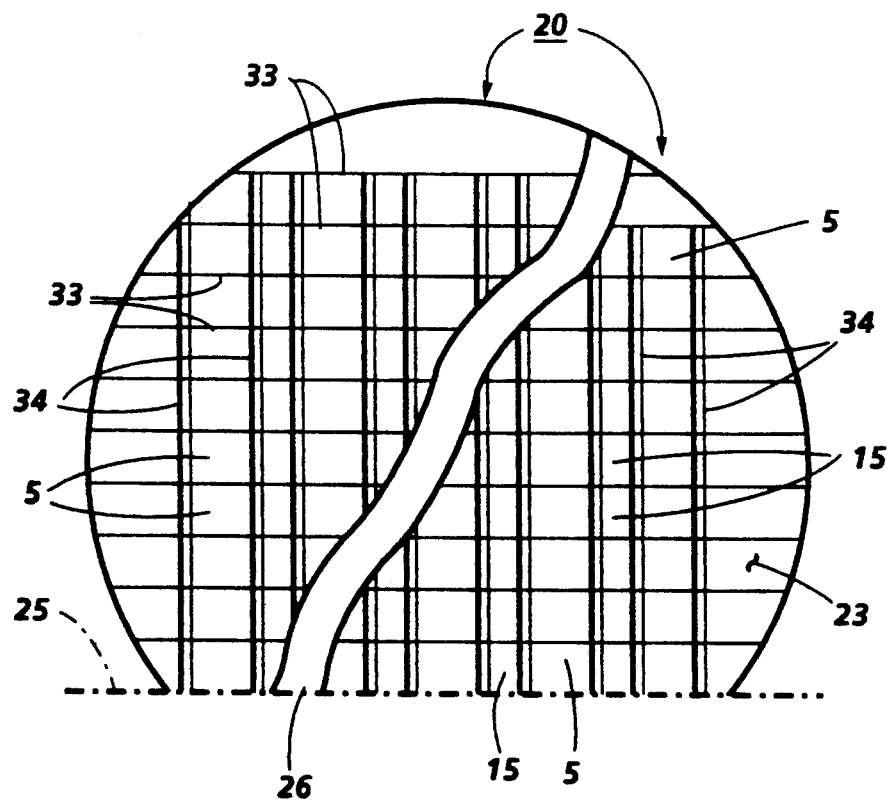
FIG. 2 is a top view of a silicon wafer prior to cutting individual dies therefrom.

Referring to FIG. 2, dies 5 are fabricated from a relatively large wafer 20 of <100> silicon of the type commonly employed to make integrated circuits. Normally, wafer 20 has a plurality of dies 5 previously fabricated thereon by integrated circuit forming techniques, it being understood that the row of photosites 14 together with any other circuitry is formed on wafer 20 prior to separating dies 5 therefrom.

V-shaped separation grooves 34 may, for example, be formed in top layer 23 of the wafer by means of standard photolithographic techniques and anisotropic etchants such as Ethylenediamine/Pyrocatechol/$H_2O$ solution (EDA). Other processes for forming grooves 34 with the exact location and size desired may be contemplated such as plasma etching, reactive ion etching, etc. As will be understood by those skilled in the art, a flat 26 is normally present on industrial wafers, which is aligned within a fraction of a degree to the (110) crystalline axis 25. This flat makes it possible for separation grooves 34 to be accurately aligned with the (110) crystalline orientation, typically within one degree. Grooves 34 delineate the short sides or "ends" 11 of the dies 5 and define therebetween a scrap portion 15 of the wafer that will eventually be scrapped as will appear more fully. Additionally, some reference pattern such as lines 33 are placed on the surface of the wafer during processing to define the long sides 6 of the dies 5.

Figure 3:
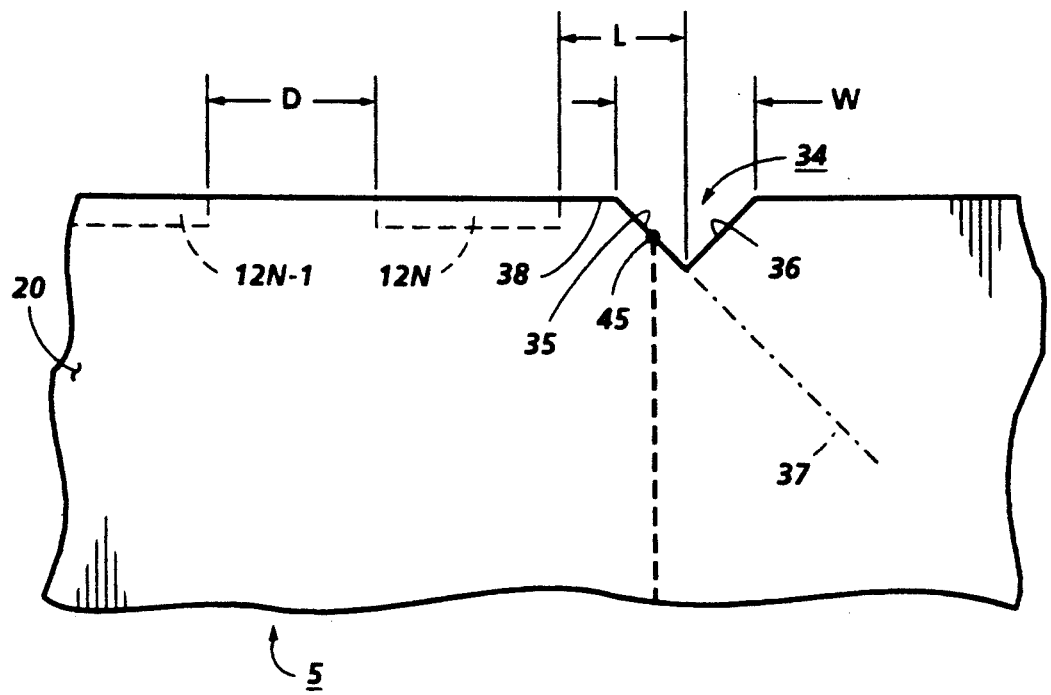
FIG. 3 is an enlarged side view in cross section of the wafer shown in FIG. 2 depicting the V-shaped die separation groove in which the wall of the groove next to the die is relatively wide in accordance with the teachings of the present invention.

Referring now to FIG. 3, grooves 34, which are V-shaped and have intersecting walls or sides 35, 36, are relatively wide with a width W of substantially 10 $\mu m$ being preferred. Walls 35, 36 of grooves 34 in wafer 20 are defined by and hence parallel to the <111> crytalline planes 37. This provides a sloped relatively wide surface without undesirable movement of the V-shaped groove 34 closer to the last photosite 12N in the row 14 of photosites. An offset 38 separates the V-shaped groove 34 from photosite 12N.

The placement of the grooves 34 is such that the midpoint 45 of the wall 35 is the nominal end of the die. The distance L represents D/2 where D represents the distance between photosites 12. As a result, when the separated dies are butted together, the total of the space between the end photosites of adjacent dies equals D plus or minus ($\pm$) the acceptable tolerance. This relationship enables a substantial uniform periodicity to be preserved among photosites across the width of the assembled scanning array 4.

During sawing as will appear, substantially one-half of the wall 35 adjoining the active die 5 together with the entire opposite wall 36 of V-shaped grooves 34 are obliterated leaving substantially one-half of wall 35 remaining to prevent cracking and chipping during sawing.

Figure 4:
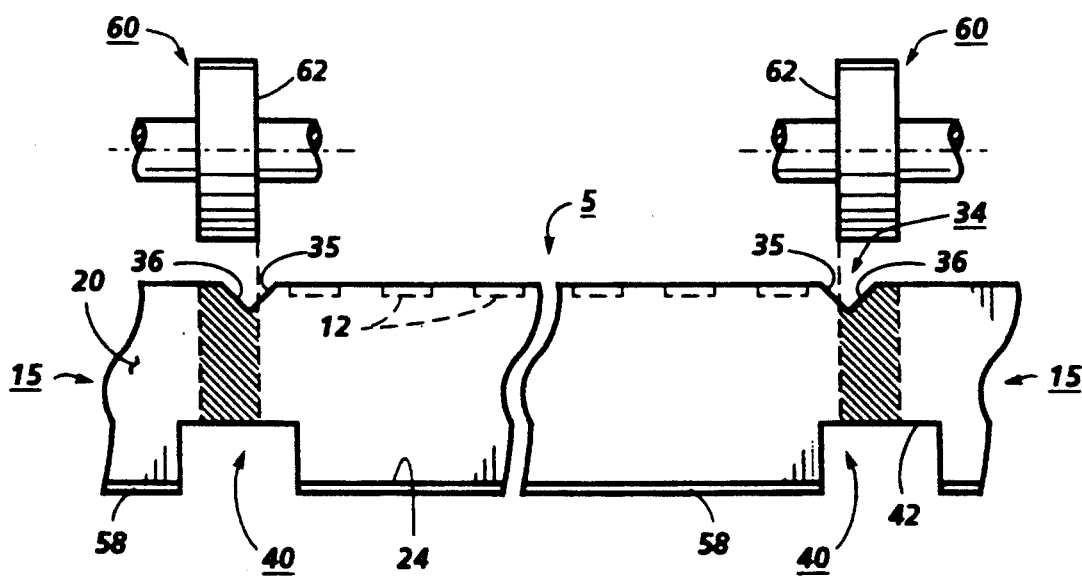
FIG. 4 is an enlarged side view in cross section of the wafer shown in FIG. 2 showing the location of the saw blade relative to the wall of the V-shaped groove during cutting.

Referring also to FIG. 4, a second groove 40 is formed in the bottom or inactive surface 24 of wafer 20 opposite and parallel to each V-shaped groove 34. Grooves 40, which may be formed mechanically by sawing, have a depth such that base 42 of grooves 40 is spaced sufficiently far from any photosites 12 or active circuits 17 on die 5 to prevent interference therewith. Grooves 40 may, following forming, be etched in EDA or another suitable anisotropic etchant to remove any stresses resulting from formation thereof. Grooves 40 are relatively wide and substantially wider than grooves 34. Grooves 40 serve to facilitate later assembly of the chip array.

Grooves 40 are normally formed only under and opposite to V-shaped grooves 34 delineating ends 11 of dies 5. Since damage to the dies 5 along the sides 6 is ordinarily not a problem inasmuch as any active circuits can be located at a safe distance from both sides 6, and since the dies in this embodiment are not intended to be operatively abutted together along either side 6, grooves 40 in opposed relation to the reference lines 33 are not ordinarily provided.

Following the forming of lines 33 and of grooves 34 and 40 in wafer 20, a suitable wafer mounting medium 58 is applied to the inactive surface 24 of wafer 20 as a means to hold the wafer securely and to control its location accurately. The wafer is thus accurately secured in position for cutting opposite a suitable cutting device such as a high speed diamond dicing blade 60. Wafer 20 is positioned in such a way that blade 60 is opposite to and above the groove 34 with the plane of blade 60 parallel with the longitudinal axis of groove 34. The side 62 of blade 60 that faces the active die 5 is substantially aligned with the midpoint 45 of the relatively wide wall 35 adjoining the active die. However, as will be understood, the relatively large area of wall 35 accommodates a degree of misalignment of blade 60 not possible heretofore where side 62 of blade 60 was required to be in substantially exact alignment with the bottom of the V-shaped groove 34 in order to provide an acceptable cut free of objectionable chipping.

It is understood that the width of blade 60 and hence the width of the cut made by blade 60 is substantially larger than the width of V-shaped grooves 34 etched in wafer 20. As a result, the remainder of blade 60 not only overlaps the remaining one-half of wall 35 but also the wall 36 of the V-shaped groove thereunder and the scrap portion 15 of wafer 20 bordering groove 34. As a result, during sawing, approximately one-half of wall 35 and all of wall 36 are obliterated or destroyed as well as the portion of the wafer 20 in scrap part 15 bordering the V-shaped groove.

Figure 5:
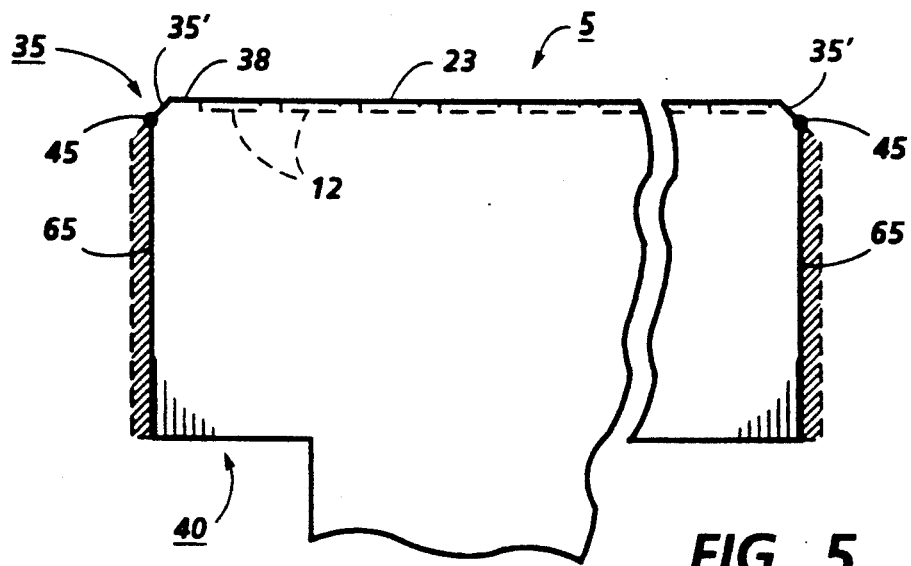
FIG. 5 is an enlarged side view in cross section depicting the remaining part of the wall of the V-shaped groove following cutting.

Referring also to FIG. 5, blade 60 cuts through wafer 20 to groove 40 in inactive side 24 of wafer 20, separating die 5 from wafer 20 and leaving a precision edge 65 with the remaining part 35' of wall 35 of V-shaped groove 34 spanning or bridging between offset 38 in the active surface 23 of the chip and edge 65 as shown in FIG. 5. Cracks, chipping, etc. resulting from the sawing action of blade 60 are concentrated at and intercepted by part 35' of wall 35, avoiding damage to the active surface 23 of the die and any circuits 17 thereon while reducing the criticality in the alignment of blade 60 with wafer 20 during cutting as explained above. As a result, a precision edge 65 is formed which enables die 5 to be assembled end to end with other like dies without loss or distortion of image at the die junctures. It will be understood that the opposite end of die 5 is formed in the same manner.

This operation is repeated in each groove 34 of wafer 20, after which the cutting is done along lines 33 to complete the cutting off of individual dies. As a result, each end 11 of die 5 is formed with a uniformly flat and smooth surface, the surfaces precisely defining the die ends and enabling die 5 to be assembled with other dies end to end to form a long array 4 composed of a plurality of dies 5.

Figure 6:
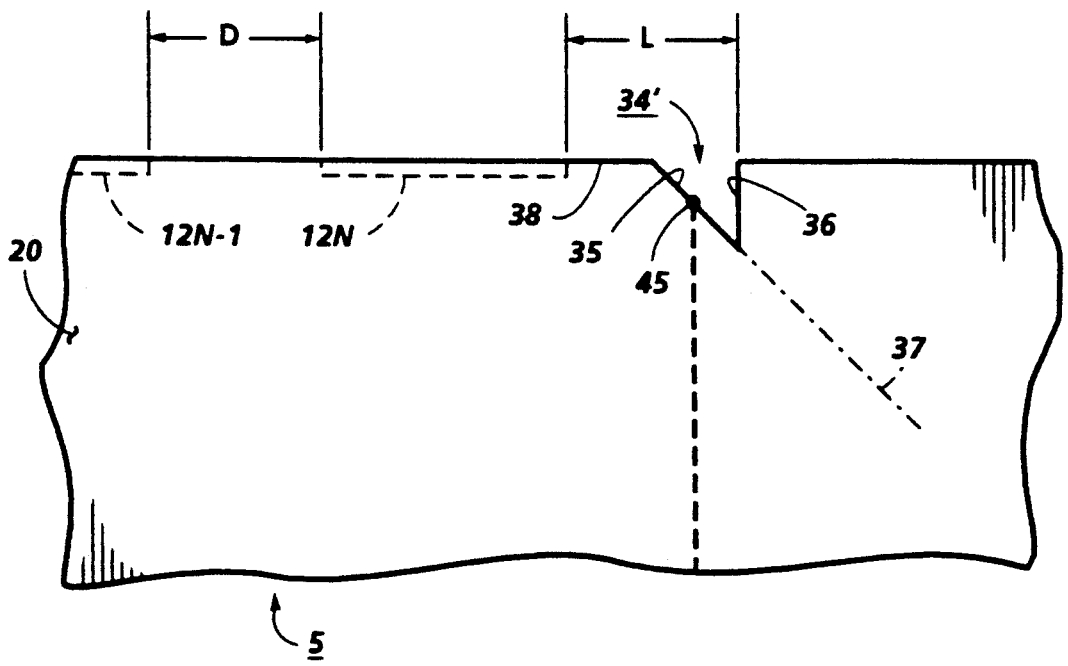
FIG. 6 is an enlarged side view in cross section of the wafer shown in FIG. 2 depicting an alternate separation groove shape providing a relatively wide wall next to the die with the opposite wall being perpendicular to the surface of the wafer.

In the embodiment shown in FIG. 6, where like numerals refer to like parts, separation grooves 34' in this embodiment are etched to provide a wall 35 having a relatively wide surface parallel to the <111> plane and a wall 36 perpendicular to the <100> plane of wafer 20. This enables formation of wall 35 with a relatively large surface area that reduces the need to exactly align saw blade 60 for successful cutting as described heretofore.

It is understood that other chemical etchants, other etching techniques such as plasma etching, etc., and/or use of materials with different crystalline orientation may result in groove shapes other than those shown and described herein. Further, that the order in which grooves 34, 40 and lines 33 are formed may be changed from that described herein. And the order in which dies 5 are cut from wafer 20 may be changed by first cutting along lines 33 followed by cutting along grooves 34. And, while grooves 34 are described as being formed by etching, grooves 34 may instead be formed by other suitable processes such as scribing, sand blasting, water jet cutting, laser cutting, etc. Similarly, forming wide grooves 40, cutting along lines 33, and/or cutting in grooves 34 may be done by other suitable processes such as water jet cutting, laser cutting, etc. instead of by sawing.

While CCD type sensor dies are shown and described herein, other types of arrays, materials other than silicon, and other crystalline orientations may be contemplated. Further, while image scanning or reading dies are described, image writing dies having, for example, one or more linear rows of selectively actuable LED's may may be contemplated.

Where two dimensional arrays are contemplated, grooves 34 may be formed along the long sides 6 of the dies as well in place of lines 33 and the dies separated from the wafer in the manner described. This provides precision faces on all four sides of the dies which enable the dies to be assembled side to side to form a two dimensional array, and end-to-end to provide a longer two dimensional array.

It will be understood that face to face assembly of dies 5 as described and shown herein may be affected through physical abutting of the die faces together or in close but spaced proximity to one another.

While the invention has been described with reference to the structure disclosed, it is not confined to the details set forth, but is intended to cover such modifications or changes as may come within the scope of the following claims.

We claim:

1. A method of fabricating a high resolution image sensor die from a <100> silicon wafer to form a precision face at each end of said die to enable said die to be abutted end-to-end with other like dies to form a longer array without image loss or distortion at the ends where said dies are abutted, comprising the steps of:
   a) forming a first groove in one side of said wafer delineating where the die is to be separated from said wafer with the wall of said first groove next to the die being relatively wide and parallel to the <111> crystalline plane of said wafer;
   b) forming a second groove in the opposite side of said wafer opposite said first groove with the axis of said second groove parallel to the axis of said first groove; and
   c) sawing said wafer along said first groove with one edge of the cut made by sawing being nominally centered on said relatively wide wall of said first groove with said relatively wide wall allowing for misalignment of the cut made by sawing while providing a remaining wall section to prevent development of fractures in the die along the cut.

2. The method according to claim 1 including the step of:
   forming said first groove so that said first groove is V-shaped.

3. The method according to claim 1 including the step of:
   forming said first groove so that said first groove is V-shaped with said wall having substantially greater area than the remaining wall of said first groove.

4. The method according to claim 3 including the step of:
   forming said first groove so that said remaining wall of said first groove is substantially perpendicular to said one side of said wafer.

5. A method of separating semiconductor image sensor dies from a larger wafer to provide dies with precision ends which enable the dies to be joined against one another end to end to form longer arrays without image loss or distortion at the points where the dies are joined, comprising the steps of:
   a) forming V-shaped grooves having first and second intersecting sides on the surface of said wafer where said dies are to be separated from said wafer with said first side of said grooves bordering the die and having an area substantially larger than said second side of said grooves to facilitate cutting and separation of said dies from said wafer;
   b) forming second grooves on the surface of said wafer opposite each of said first grooves, said second grooves being deeper than said first grooves and less than the thickness of said wafer, said second grooves being wider than said first grooves to facilitate assembly of said dies with other like dies; and
   c) making a relatively wide cut through said wafer along said grooves with one edge of said cuts being at a point along a line substantially centered through said first side area to thereby avoid the need to exactly align said cut with a predetermined point in said grooves while producing a cut without fracturing of said wafer at said cut.

6. A method for producing photosensitive scanning dies having precisely controlled ends enabling one of the dies to be assembled against another of the dies to form a longer composite array without distortion or damage to the image scanning properties of the dies, the dies being cut from a larger <100> silicon wafer, comprising the steps of:
   a) etching first grooves in one side of said wafer defining said die ends, the walls of said first grooves paralleling the <111> crystalline plane of said wafer;
   b) forming relatively wide second groove in the opposite side of said wafer in association with each of said first grooves, the axis of each of said second grooves being parallel to the axis of said first groove associated therewith; and
   c) cutting said dies from said wafer by sawing through said wafer at each of said first grooves with one edge of the cut made by sawing being substantially centered along the wall of said first grooves adjoining said die so that the remaining part of said wall together with the opposite wall of said first grooves are destroyed and fracturing and chipping thereof resulting from said sawing avoided so as to provide dies with uniform precise ends and without damage to active elements on said dies proximate said die ends.

7. A method for producing photosensitive scanning dies having precisely controlled ends enabling one of the dies to be assembled against another of the dies to form a longer composite array without distortion or damage to the image scanning properties of the dies, the dies being cut from a larger <100> silicon wafer, comprising the steps of:
   a) forming first grooves in one side of said wafer defining said die ends with at least the wall of said first grooves that adjoining the dies being parallel to the <111> crystalline plane of said wafer;
   b) forming second grooves in the opposite side of said wafer in association with each of said V-shaped grooves, the axis of each of said second grooves being parallel to the axis of said V-shaped groove associated therewith;
   c) cutting said dies from said wafer by sawing through said wafer at each of said V-shaped grooves to provide a cut substantially wider than the width of said V-shaped grooves; and
   d) locating said cut so that the edge of said cut closest to said dies is substantially aligned with the midpoint of said wall whereby said cut removes part of said wall together with the opposite wall of said V-shaped grooves to reduce fracturing and chipping resulting from said sawing and provide dies with uniform precise ends.

8. The method according to claim 7 including the step of:
   forming said first grooves so that said wall provides a substantially larger area than said opposite wall whereby to facilitate locating said cut.

9. The method according to claim 7 including the step of:
   forming said first grooves so that said opposite wall is substantially perpendicular to said one side of said wafer.

10. The method according to claim 7 including the step of:
   repeating steps a–d at the opposite end of said dies.

11. A method of separating semiconductor image sensor dies from a larger wafer to provide dies with precision ends which enable the dies to be joined against one another end to end to form longer composite array without image loss or distortion at the points where the dies are joined, comprising the steps of:
   a) non-mechanically forming V-shaped grooves on the surface of said wafer where said dies are to be separated from said wafer, said V-shaped grooves having first and second intersecting walls;
   b) mechanically forming second grooves on the surface of said wafer opposite each of said V-shaped grooves to facilitate separating individual dies from said wafer, said second grooves being deeper than said V-shaped grooves, said second grooves being wider than said V-shaped grooves; and
   c) mechanically cutting through said wafer along said V-shaped grooves with one edge of the cut being substantially aligned with the midpoint of said first wall of said V-shaped grooves,
   the width of said cut being greater than the width of said V-shaped grooves whereby substantially one half of said first wall of said V-shaped grooves together with said second wall of said V-shaped grooves are removed by said cut while the remaining substantially one half of said first wall of said V-shaped grooves remains substantially intact whereby said cut separates said individual dies from said wafer with the ends of said dies being smooth and undistorted.

12. The method according to claim 11 including the step of mechanically forming said second grooves by sawing.

13. The method according to claim 11 including the step of non-mechanically forming said V-shaped grooves by anisotropic etching.

14. The method according to claim 11 including the steps of:
  providing a <100> silicon for said wafer; and
  forming at least said first wall of said V-shaped grooves so that said first wall is parallel to the <111> plane of said wafer.

15. The method according to claim 14 including the step of:
  forming said second wall of said V-shaped grooves perpendicular to the surface of said wafer.

* * * * *